(12) United States Patent
Emma et al.

(10) Patent No.: US 6,952,352 B2
(45) Date of Patent: Oct. 4, 2005

(54) INTEGRATED CIRCUIT CHIP PACKAGE WITH FORMABLE INTERMEDIATE 3D WIRING STRUCTURE

(75) Inventors: Philip G. Emma, Danbury, CT (US); Robert K. Montoye, Austin, TX (US); Arthur R. Zingher, White Plains, NY (US)

(73) Assignee: International Business Machines Corp., Armonk, NY (US)

( * ) Notice: Subject to any disclaimer, the term of this patent is extended or adjusted under 35 U.S.C. 154(b) by 115 days.

(21) Appl. No.: 10/314,599

(22) Filed: Dec. 9, 2002

(65) Prior Publication Data

US 2004/0109283 A1 Jun. 10, 2004

(51) Int. Cl.[7] .............................. H05K 7/10; H05K 7/12
(52) U.S. Cl. ....................... 361/767; 361/749; 361/782; 174/254; 174/260
(58) Field of Search .......................... 361/749, 782–784, 361/792–795; 174/254, 258, 260–261; 257/723–724

(56) References Cited

U.S. PATENT DOCUMENTS

| | | | | |
|---|---|---|---|---|
| 5,206,463 A | * | 4/1993 | DeMaso et al. ............ | 174/254 |
| 5,483,421 A | * | 1/1996 | Gedney et al. ............. | 361/771 |
| 6,444,921 B1 | * | 9/2002 | Wang et al. ................ | 174/260 |

* cited by examiner

*Primary Examiner*—Kamand Cuneo
*Assistant Examiner*—Tuan Dinh
(74) *Attorney, Agent, or Firm*—Law Office of Charles W. Peterson, Jr.; Louis J. Percello, Esq.; Satheesh K. Karra, Esq.

(57) ABSTRACT

A formable wiring structure, an interposer with the formable wiring structure, a multichip module including the interposer and in particular a microprocessor and L2, L3 cache memory mounted on the interposer. The formable wiring structure includes wiring layers separated by dielectric layers. Attachment locations for attaching to module substrates, printed circuit cards or for mounting chips (microprocessor and cache) are provided on at least one interposer surface. The microprocessor is centrally located opposite a module attach location and the cache chips are on portions that are bent away from the module attach location to reduce and minimize module real estate required.

19 Claims, 11 Drawing Sheets

FIG.2

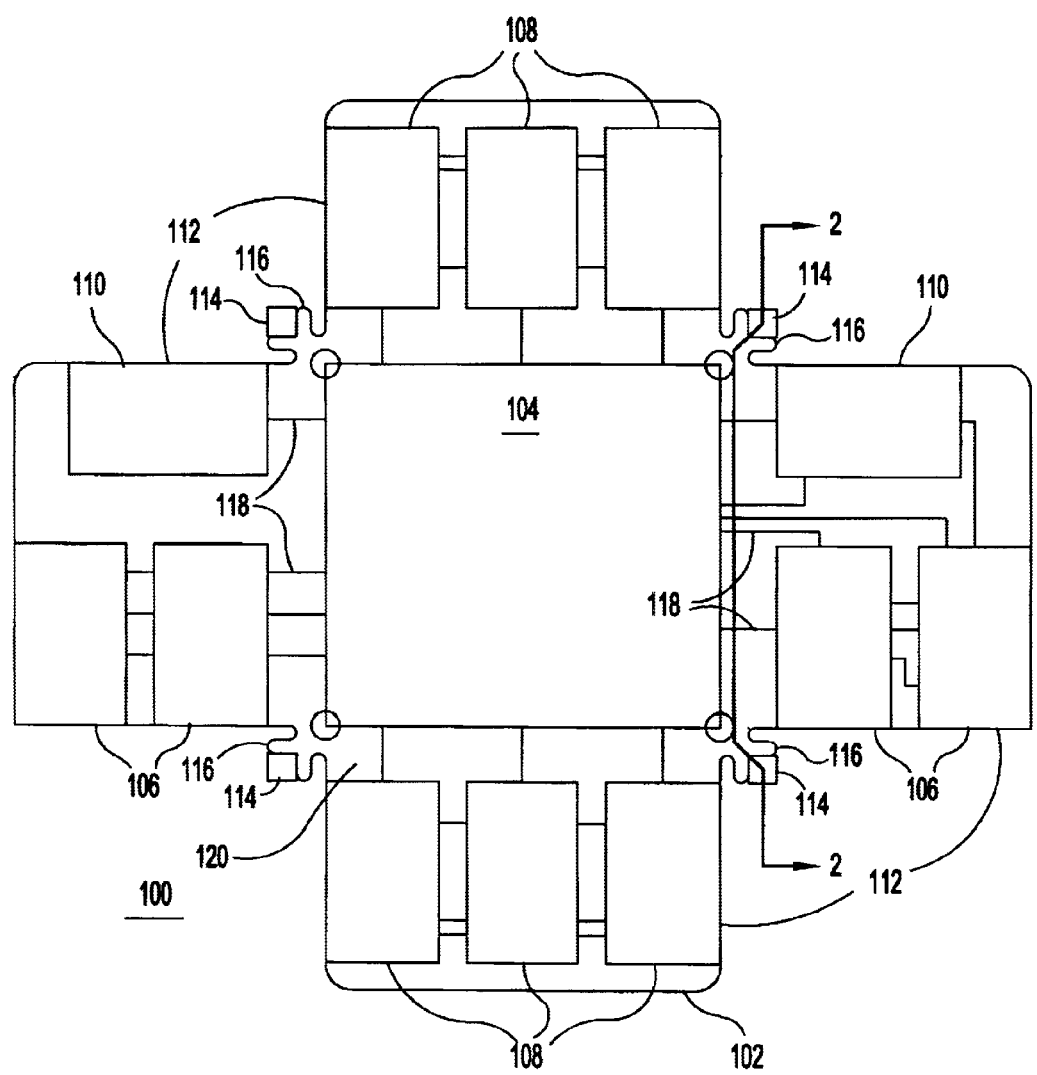

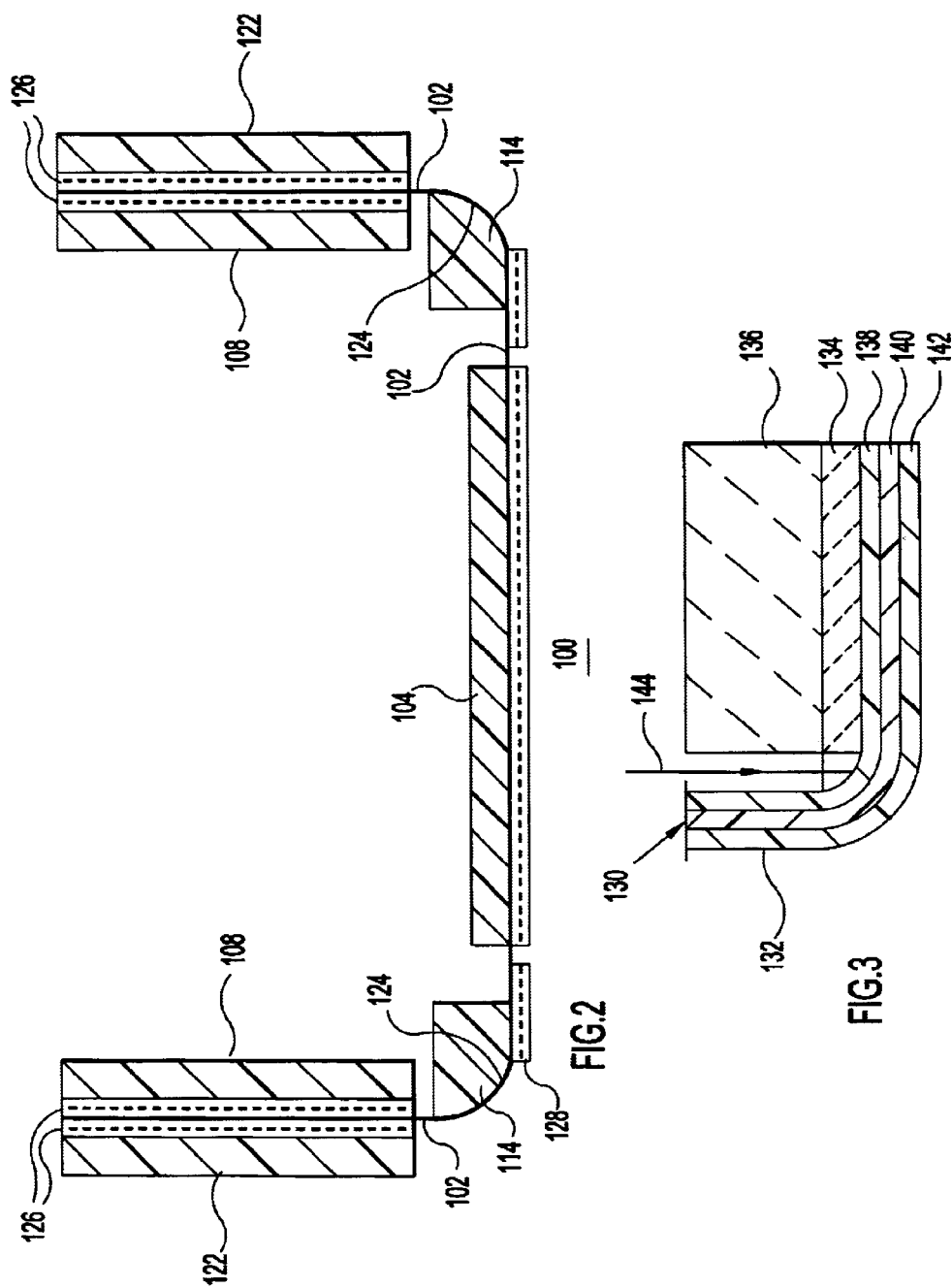

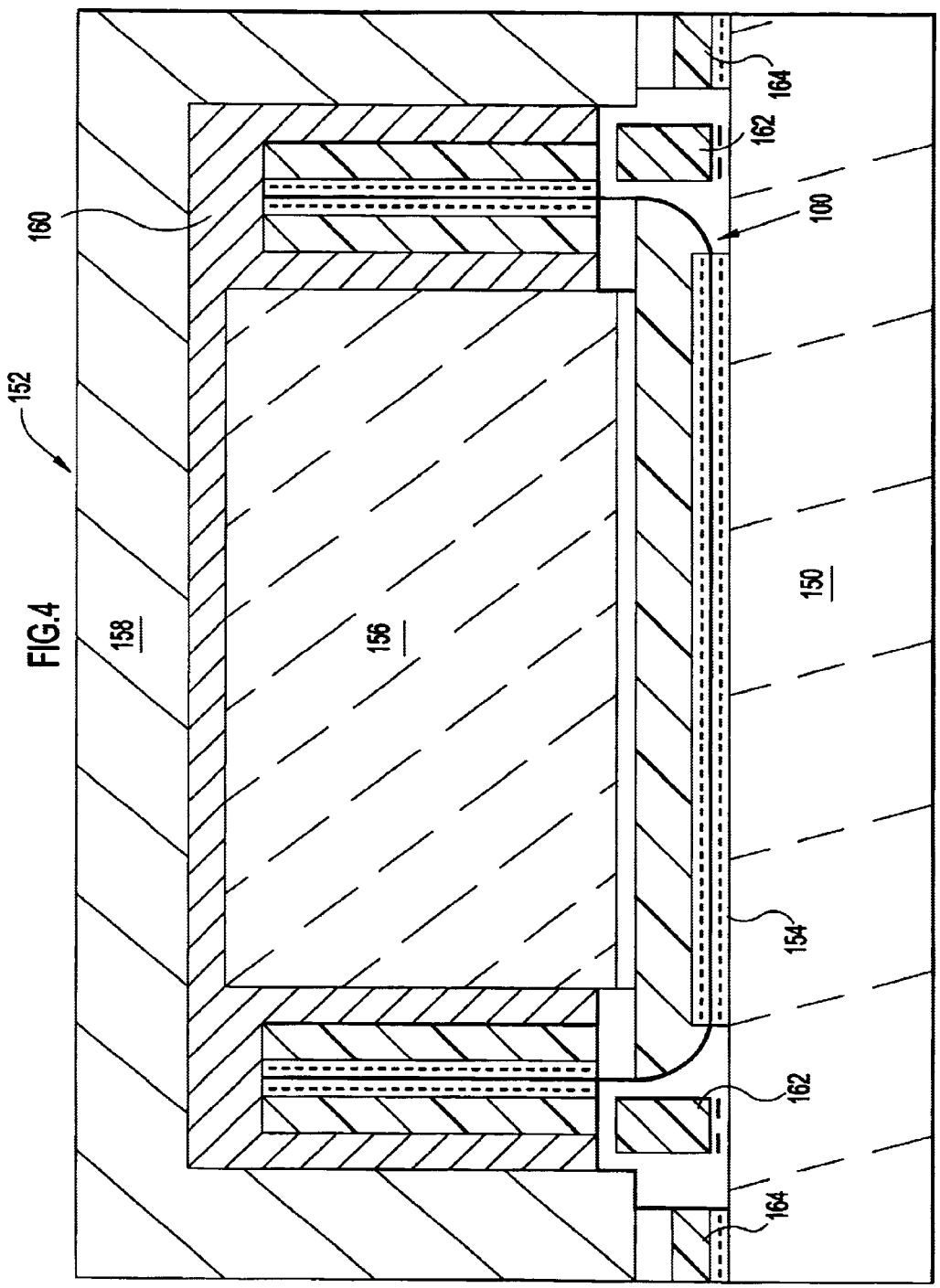

US 6,952,352 B2

INTEGRATED CIRCUIT CHIP PACKAGE WITH FORMABLE INTERMEDIATE 3D WIRING STRUCTURE

BACKGROUND OF THE INVENTION

1. Field of the Invention

The present invention generally relates to integrated circuit packaging and in particular, to a conformable multilayered wiring structure for connecting one or more integrated circuit chips mounted thereon together or to a module substrate or a printed circuit card.

2. Description of the Related Art

Performance and signal density demands are forcing single chip modules (SCMs) and, especially, multi-chip modules (MCMs) to become more and more complex with an ever-increasing number of wiring layers. Typically, each chip, some >4 centimeters (cm) on each side, may have a grid of chip input/output (I/O) pads with a solder ball located on each, also called a ball grid array (BGA). State of the art SCMs include a single chip mounted on a relatively simple substrate that may reroute chip I/Os and expands the chip I/O pitch from the closely spaced chip pad pitch (e.g., 100 micrometer ($\mu$m or micron) square or less signal pads on 200 micron centers) to the more coarsely spaced module I/O pin spacing, e.g., 1 millimeter (mm). State of the art MCM substrates (typically ceramic) are much more complex because, in addition to fanning individual chip I/O signals out from chip pad pitch to module pad pitch, the substrate contains multiple layers of wiring for common chip I/O signals, power, ground and for inter-chip signals between MCM chips. Thus, because of the need for additional wiring, substrate complexity is directly related to the number of chips mounted on the substrate. Each wiring layer increases the substrate cost. So, typically MCMs are much more expensive than SCMs.

SCM and MCM modules are attached to printed circuit boards, which are assembled into a system. Generally, reducing collective board space reduces system size. Board size is directly related to the number and size of the board modules. Board complexity is a function of the number of each module's I/Os. The number of I/Os for each module is determined by the number of chip signals that must be passed to other units (chips, display drivers, etc.) and cannot be contained within the module substrate as inter-chip substrate wiring.

Thus for example, newer generations of microprocessors ($\mu$Ps), such as the Pentium IV from Intel Corporation or the Athlon XP from AMD Corporation, each include both on-chip (level 1 or L1) and off-chip (level 2 or L2) memory caches. These L1 and L2 caches are closely integrated with the particular $\mu$Ps, interfacing each with high speed local memory and provide a significant performance advantage for any routines, subroutines or instructions that can be contained within the caches. To contain $\mu$P packaging costs, typically, relatively cheap, lower density packaging (an opposed to much more expensive ceramic MCMs), is used to include cheap memory chips with a much more expensive $\mu$P. These cheaper packages usually trade performance for cost but, still realize a major performance improvement because the L2 cache memory is placed (electrically) so much closer to the $\mu$P than other system memory. As described herein above, any execution that requires the $\mu$P to access main memory, i.e., out of module or off board, incurs a notable performance hit.

So, just as with packaging closely integrated L2 caches with $\mu$ps, designers attempt to minimize out of module communications by increasing module density, i.e., by increasing the number of chips on each MCM. The simplest way to increase overall module density is to push module chips closer together. However, once chips butt up against each other, they can't be pushed any closer. Also, adding chips increases wiring complexity, typically by requiring additional wiring layers. Another way density may be increased is by mounting a number of chips on cheaper multilayer interposers and attaching the interposers to the much more expensive MCM substrate. Typically, interposers have multiple wiring, power and ground layers separated by an inexpensive dielectric material, such as a resin composite material of resin epoxy and fiberglass, namely Fire Retardant-4 (FR-4), or a nonconductive organic insulator material. Usually, the chips are attached to the interposer and the interposer is attached to the substrate, adding a layer of chips above substrate mounted chips.

Thus, there exists a need for increased module density and more particularly for increasing available cache memory and decreasing the distance between microprocessors and cache memory.

SUMMARY OF THE INVENTION

It is a purpose of the present invention to reduce processor power consumption, without appreciable performance loss.

The present invention is a formable wiring structure, an interposer with the formable wiring structure, a multichip module including the interposer and in particular a microprocessor and L2, L3 cache memory mounted on the interposer. The formable wiring structure includes wiring layers separated by dielectric layers. Attachment locations for attaching to module substrates, printed circuit cards or for mounting chips (microprocessor and cache) are provided on at least one interposer surface. The microprocessor is centrally located opposite a module attach location and the cache chips are on portions that are bent away from the module attach location to reduce and minimize module real estate required.

BRIEF DESCRIPTION OF THE DRAWINGS

The foregoing and other objects, aspects and advantages will be better understood from the following detailed description of illustrative embodiments of the invention with reference to the drawings, in which:

FIG. 1 shows a plan view example of a first preferred embodiment multichip package subassembly according to the present invention;

FIG. 2 shows an formed example of a cross sectional view showing chips mounted to the back side of petals;

FIG. 3 is an example of a cross section of a formable printed wiring structure at a corner of a formed flower at a petal adjacent to primary logic chip;

FIG. 4 shows an example of the subassembly of FIG. 1 formed and mounted on a typical state of the art ceramic substrate in a section of a typical MCM package;

DESCRIPTION OF PREFERRED EMBODIMENTS OF THE INVENTION

Figure 6:
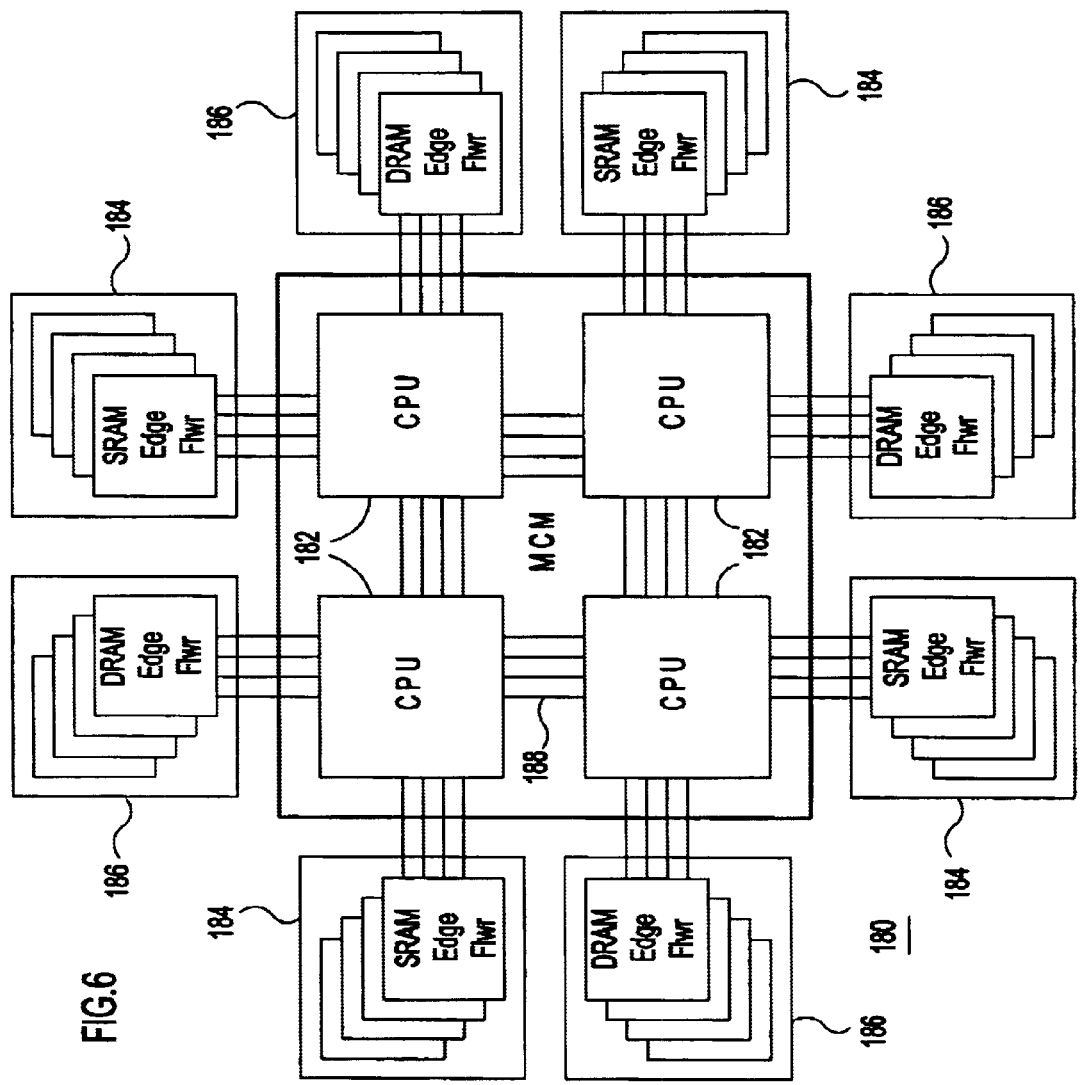
FIG. 6 shows an example in block diagram of a multiprocessor flower substrate in another preferred embodiment.

Turning now to the drawings and, more particularly, FIG. 1 shows a plan view example of a first preferred embodiment multichip package subassembly 100 according to the present invention. In this embodiment, a formable printed wiring structure, for chip mounting in this example, forms a formable multilayer interposer 102. Multilayer interposer 102 is formable because it can be bent (formed) once and holds that form thereafter, as opposed to "flexible" which would allow bending multiple times without changing its relaxed state. The formable multilayer interposer 102 is populated by a primary logic chip 104, tightly coupled local storage 106, 108 and any necessary glue logic 110 mounted on side extensions 112. Preferably, although not shown in this figure, chips are mounted on both surfaces (i.e., top and bottom) of side extensions 112. Decoupling capacitors (decaps) 114 are strategically located on tabs 116, close to the primary logic chip 104. Interposer wiring 118 connects local and off-interposer signals to the interposer chips 104, 106, 108, 110.

Although shown in this example with a single primary logic chip 104, multiple primary logic chips 104 may be included in the preferred embodiment subassembly 100 as further described herein below. Thus, primary logic chip 104 may be a microprocessor ($\mu$P) with local storage chips 106 being static random access memory (SRAM) in a local level 2 (L2) cache. Further, storage chips 108 may be high speed local dynamic random access memory (DRAM) for a level 3 (L3) or hypercache. Also, since preferred interposer 102 is formable, prior to assembling the interposer 102 into a next level or final assembly, side extensions 112 and tabs 116 are folded upward, e.g., at 90° to the plane of central portion 120 upon which primary logic chip 104 is mounted. Thus, the formed subassembly 100 resembles a flower with side extensions 112 as petals.

Thus, FIG. 2 shows an formed example of a cross sectional view of subassembly 100 though 2—2 showing backside chips 122 mounted to the back side of petals 112. A rim 124 (shown outboard of decaps 114 in this example) operates to shape how the interposer 102 bends when it is formed into the flower shape. Preferably, each chip 104, 106, 108, 110, 122 is attached at a chip attachment location 126 with a typical chip attachment, e.g., ball grid array (BGA) or Controlled Collapsible Chip Connections (C4's) and protected by a typical module attach underfill. Also in this example, C4s are provided in a module mount location 128 directly opposite the primary logic chip 104.

FIG. 3 is an example of a cross section of a formable printed wiring structure 130 at a corner of a formed flower at a petal 132 adjacent to primary logic chip 134. A heat spreader 136 or heat sink is thermally joined to the primary logic chip 134. The heat spreader 136 may be joined using a suitable medium or low temperature solder, a thermal adhesive or thermal paste. Insulating layers 138, 140, 142, (three in this example) preferably are of a suitable organic insulating material. The minimum bend radius depends upon the thickness of the formable printed wiring structure itself, in particular at the inner (top) bend surface and, is determined by rim 144, which may be, for example, polytetrafluoroethylene (PTFE) or any material suitable for maintaining the bending radius. Optionally, for added bending, wires in the wiring layers may have axial V or U shaped loops or jogs along the direction of the bending axis, i.e., into or out of the page. These loops may become necessary for thicker formable printed wiring structures with several layers. As with the bending radius and rim 144, loop size will depend upon the number of layers and wire position within the layers.

FIG. 4 shows an example of the subassembly 100 of FIG. 1 formed as described hereinabove and mounted on a typical state of the art ceramic substrate 150 and packaged in a section of a typical MCM package 152 according to a preferred embodiment of the present invention. Preferably, the flower 100 is to attached to ceramic substrate 150 at a typical chip to substrate attachment site, e.g., connector land grid array (LGA) 154. Heat spreader 156 is thermally joined to the primary logic chip 104 using a suitable medium or low temperature solder, a thermal adhesive or thermal paste. A cold hat or evaporator cap 158 is in thermal contact with the flower 100 through thermal joint paste 160. Substrate decaps 162 are strategically located around the flower 100 to provide sufficient power supply decoupling for the flower 100, as well as for adjacent chips 164. Also, although not shown in this example, adjacent chips 164 may be similar or identical flowers 100, e.g., hypercached $\mu$Ps in a massively parallel processor MCM.

Figure 5:
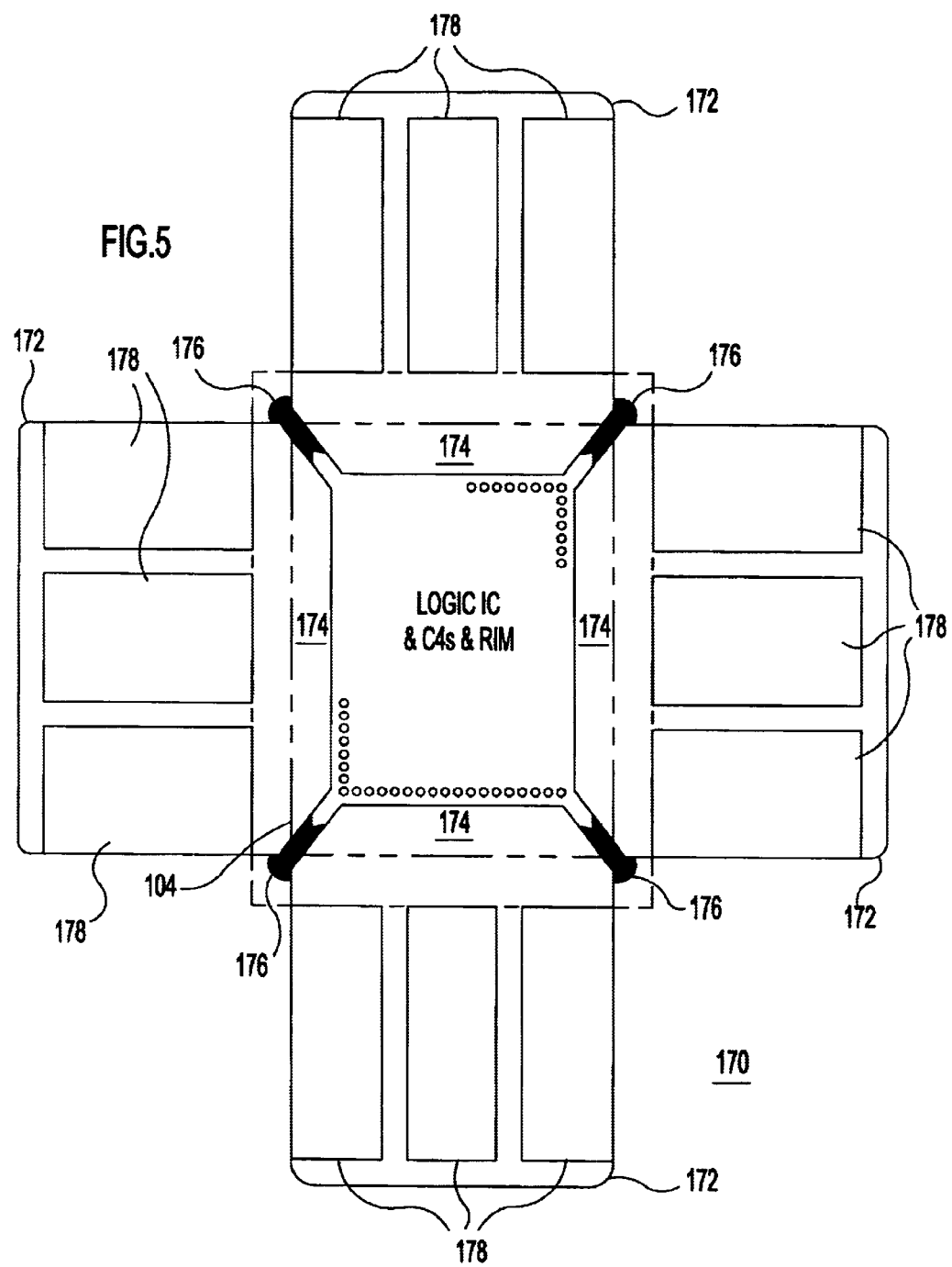
FIG. 5 shows an example of a plan view example of another preferred embodiment multichip package subassembly.

FIG. 5 shows an example of a plan view example of another preferred embodiment multichip package subassembly 170 according to the present invention with like elements labeled identically. In this embodiment, the petals 172 are individually formed substantially as the formable printed wiring structure 100 of FIG. 1 and attached to the primary logic chip 104, e.g., at edge BGA or C4 solder ball locations 174. An individual rim 176 may be located around the primary logic chip 104 or, optionally, a suitable chip cap may serve as rim 176. Also, substrate connections may be provided in petal I/O areas 174 for passing signals between the substrate (not shown) and chips on each petal 172 and for signals from feeding primary logic chip 104 directly through to the substrate. Otherwise, if petals 172 do not include substrate connections, once attached to the primary logic chip 104, chips 178 on each petal 172 communicate directly only with other chips on the same petal 172 and the primary logic chip 104 and are otherwise isolated. As with the above described first preferred embodiment, petals 172 of multichip package subassembly 170 are formed at right angles to the plane of the primary logic chip to form a flower-like shape.

FIG. 6 shows an example in block diagram of a multiprocessor flower substrate 180 in another preferred embodiment of the present invention. In this example, four (4) identical $\mu$Ps 182 each have petals 184, 186 connected on two sides, providing a local private L2 and L3 cache, respectively. In this example, $\mu$Ps 182 can communicate with each other and share common signals through typical substrate wiring 188. Caches 184, 186 are isolated to communicate only with their respective $\mu$P 182. Optionally, as previously described, connections between the individual $\mu$Ps 182 and their respective caches 184, 186 may be provided off-module for loading/unloading independent of the $\mu$Ps 182.

Figure 7:
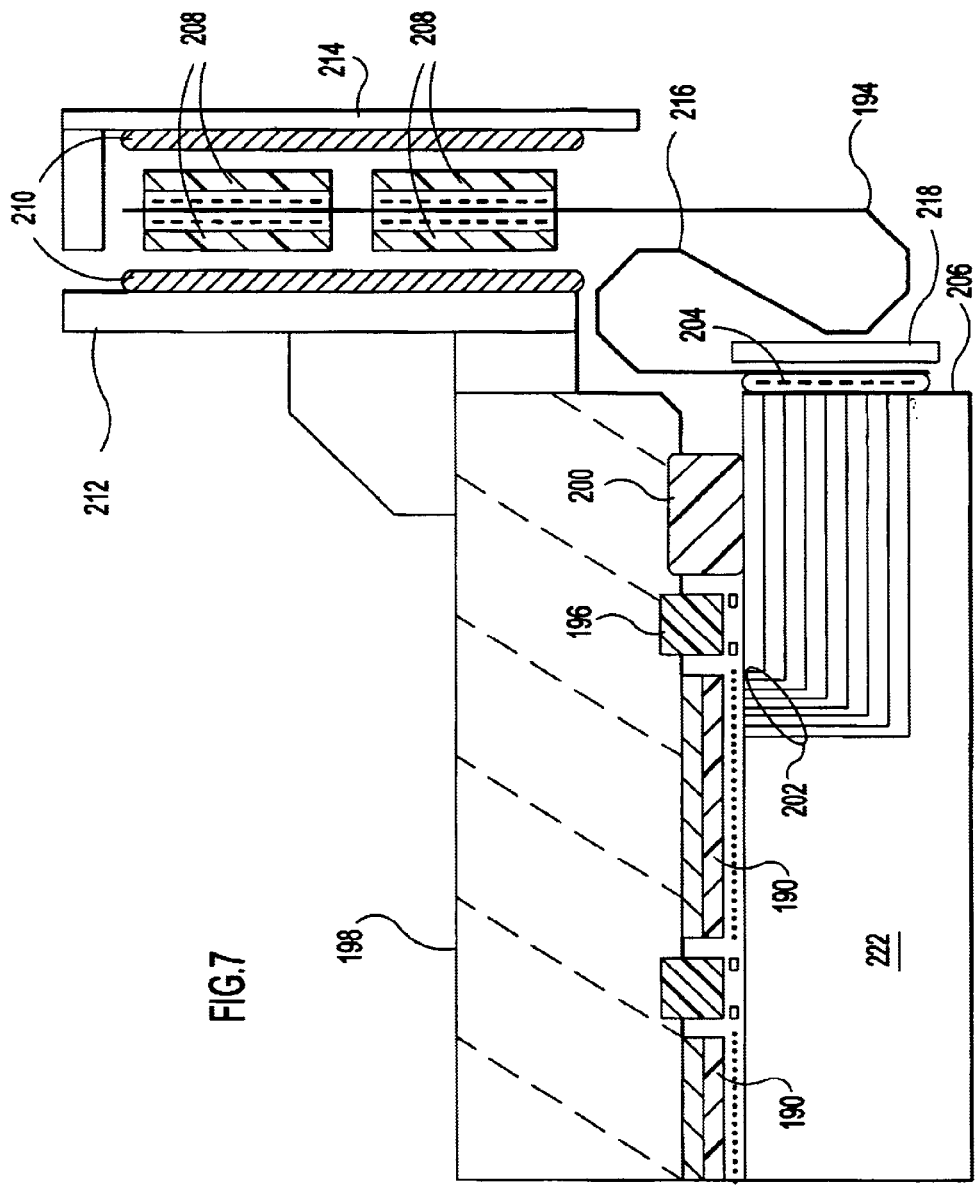
FIG. 7 shows an example in cross section, wherein logic chips are mounted on an MCM substrate and petals are side mounted to the substrate.

FIG. 7 shows an example in cross section of a variation on the embodiment of FIG. 5, wherein logic chips 190 are mounted on an MCM substrate 192 and petal subassemblies 194 are side mounted to the substrate 192. The petal subassemblies 194 are mounted on the substrate 192 using an appropriate chip attachment technique, e.g., C4s or BGA. Decaps 196 are appropriately located on the substrate to decouple power supply noise to the chips. A typical module cover, e.g., a cold hat 198, is thermally joined to the chips 190, mounted on the substrate 192 and sealed 200. Signal wiring paths 202 are provided to petal terminals 204 on substrate sidewall 206. Petal subassemblies 194 are attached to petal terminals 204 at sidewalls 206. As with the above described petals, chips 208 are attached to both petal surfaces. In this embodiment, a thermal pad 210 is attached to each of cold wall 212 and cold lid 214, which are each thermally joined to chips 208. Also in this embodiment, the petal is formed into an S shape 216 at the sidewall attach. The S shape 216 provides slack and allows the petal to bend at the substrate 192. Petal terminals 204 may provide attachment with LGA or BGA and underfill. A pressure plate 218 is provided for LGA attach.

Figure 8:
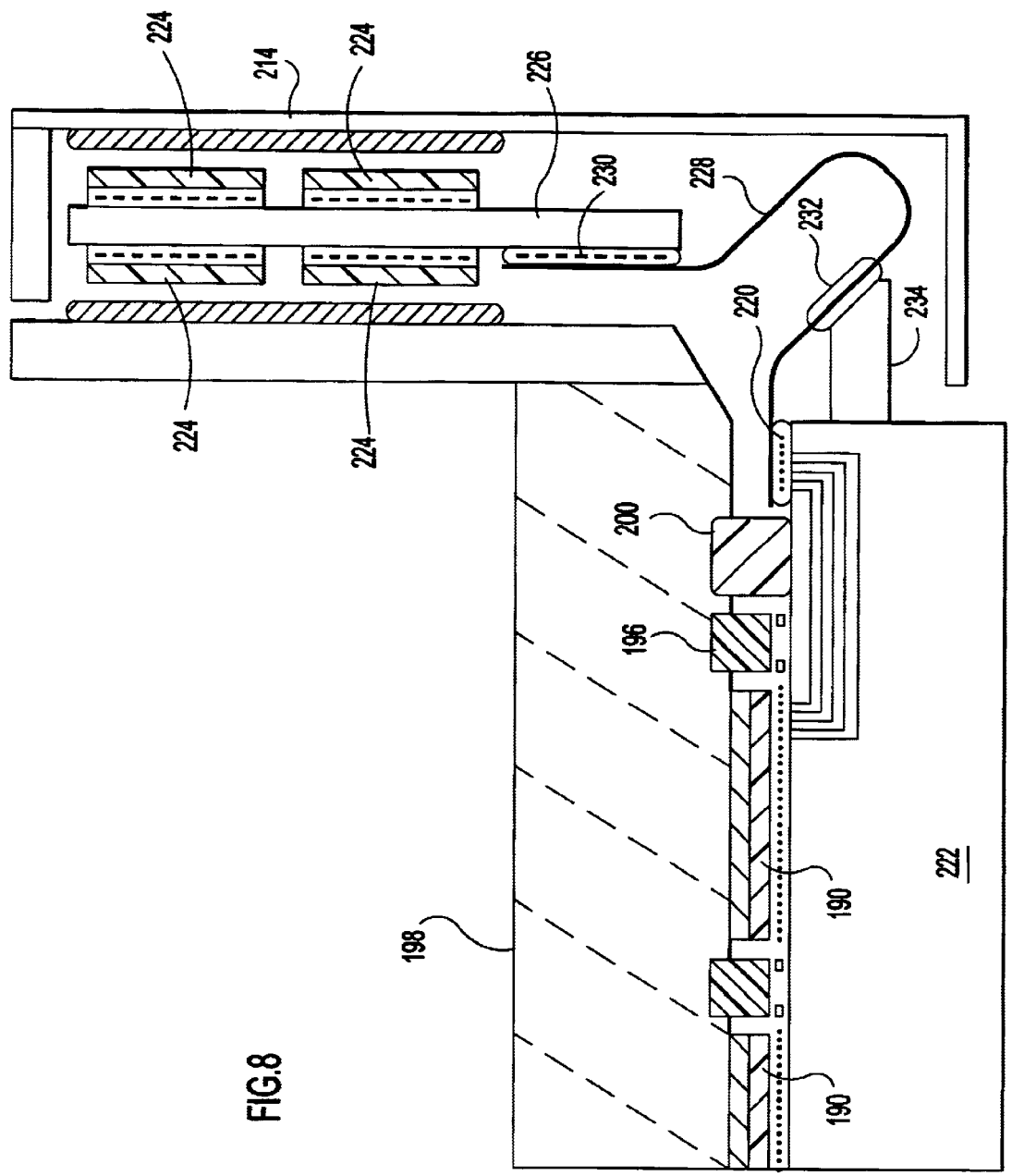
FIG. 8 shows an example in cross section of a further variation on the embodiment of FIGS. 5 and 7.

FIG. 8 shows an example in cross section of a further variation on the embodiment of FIGS. 5 and 7 with like elements labeled identically. In this example, petal terminals 220 are provided at the periphery of the top surface of the MCM substrate 222. Also, chips 224 are mounted on a printed circuit card 226 instead of the formable printed wiring structure 228. The formable printed wiring structure 228 is an intermediate attach structure attached to the printed circuit cards 226 at edge attach locations 230. Thus, in this embodiment the intermediate attach structure 228 attaches the printed circuit cards 226 to substrate 222. The intermediate attach structure 228 may have an extended loop 228 for flexing and for added stability, may be adhesively 232 attached to a stubber post 234 at the side of the substrate 222.

Figure 9:
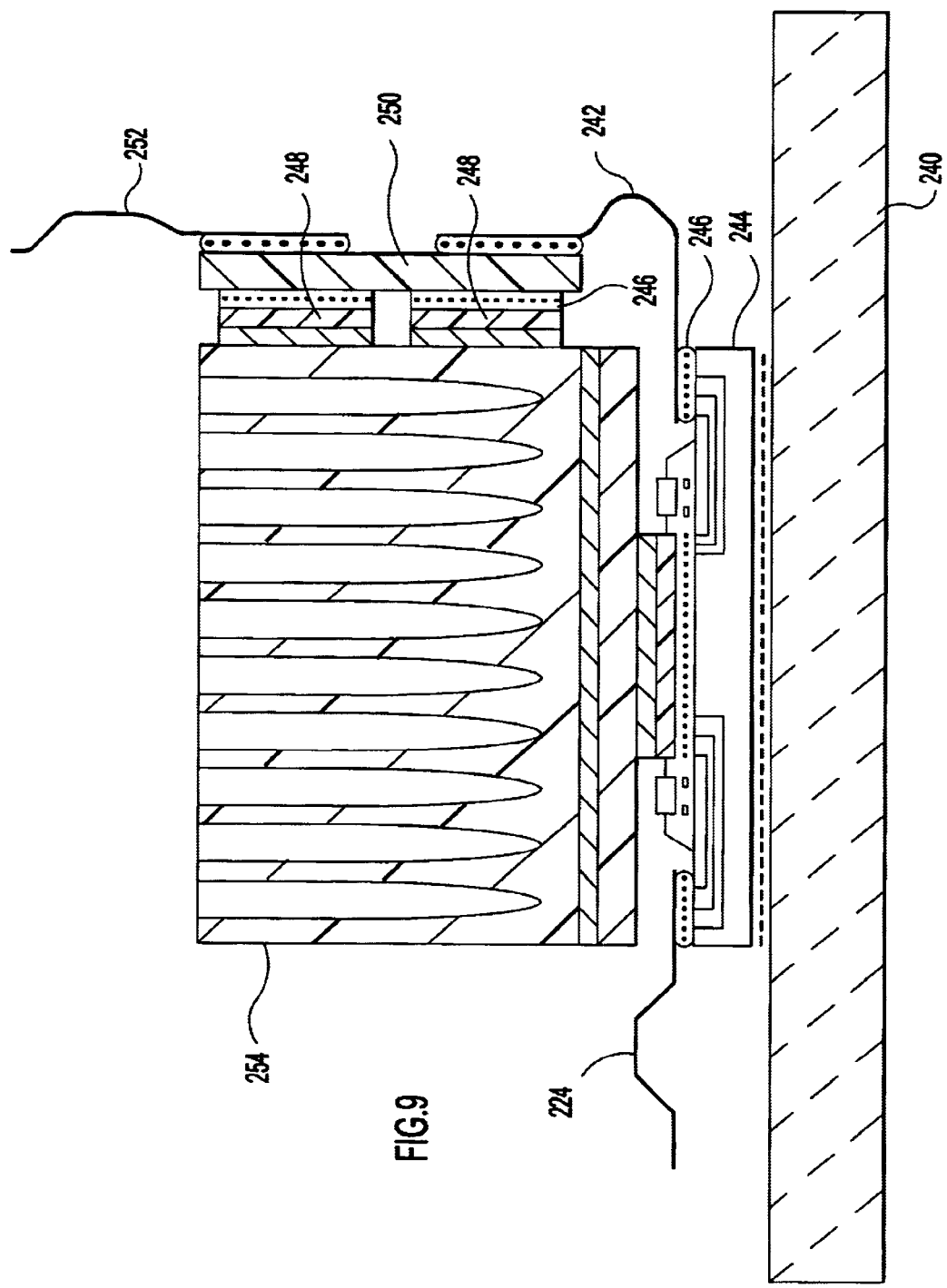
FIGS. 9–12 show various examples in cross section attached to a printed circuit board.

FIG. 9 shows another example in cross section substantially similar to the variation of FIG. 8 with like elements labeled identically and attached to a printed circuit card 240. In this example, intermediate attach structures 242 are attached to substrate 244 at terminals 246. Chips 248 are mounted on one side of printed circuit card 250 and thermally joined to module heat sink 250. Also, an optical or electronic ribbon cable 252 may be attached to the circuit board 240 for added I/Os.

Figure 10:
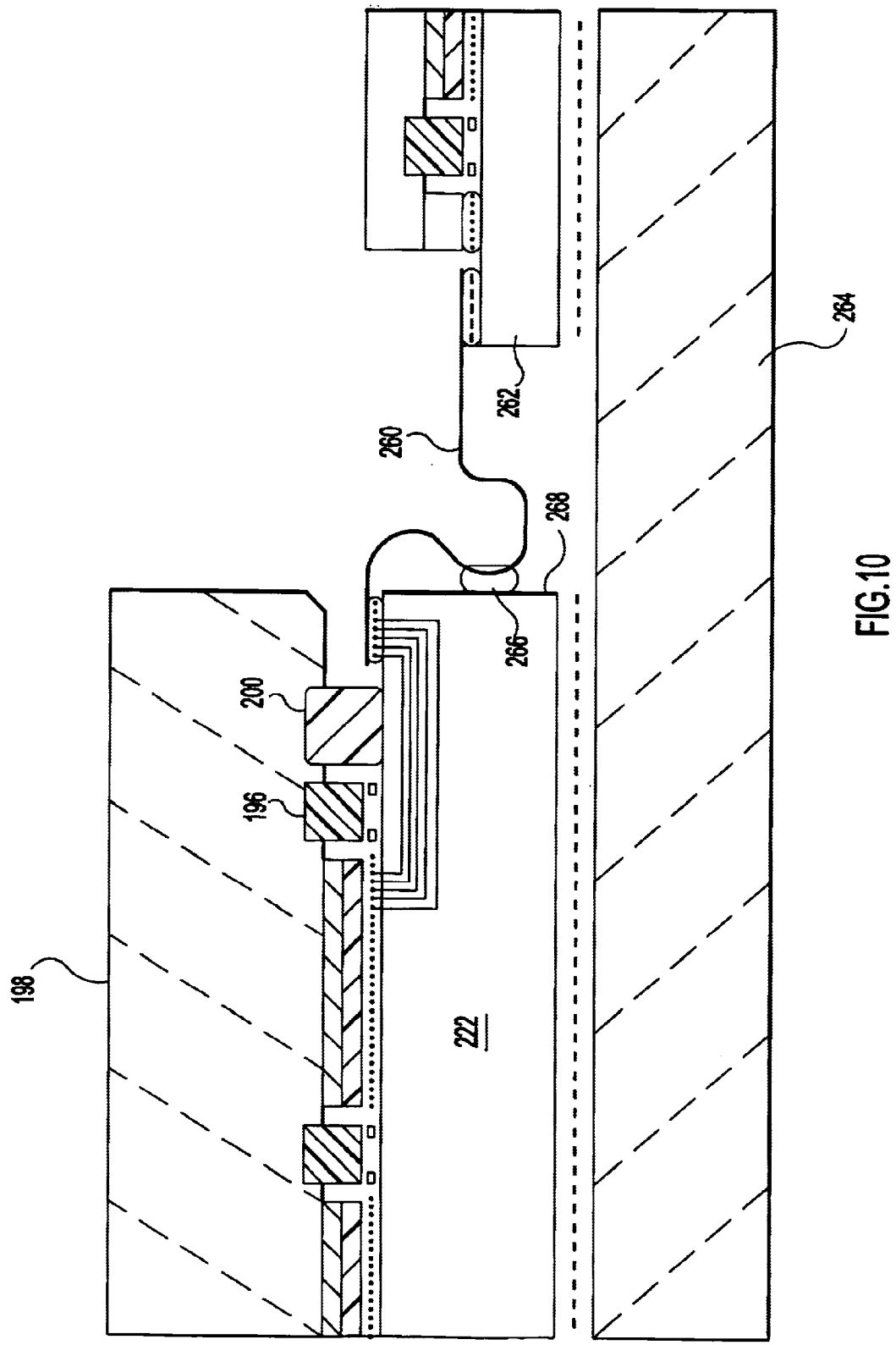

FIG. 10 shows another example in cross section substantially similar to the variation of FIG. 8 with like elements labeled identically. In this example, intermediate attach structures 260 are an intermediate module connection attaching module substrate 222 to adjacent module substrate 262. After mounting each module 222, 262 on printed circuit card 264, the intermediate attach structure 260 is attached to adjacent module substrate 262 using any typical attachment method. Thus, signals pass directly between module substrates 222, 262 without passing to the printed circuit boards. An optional stubber 266 adhesively attaches the intermediate attach structures 260 to the module substrate sidewall 268.

Figure 11:
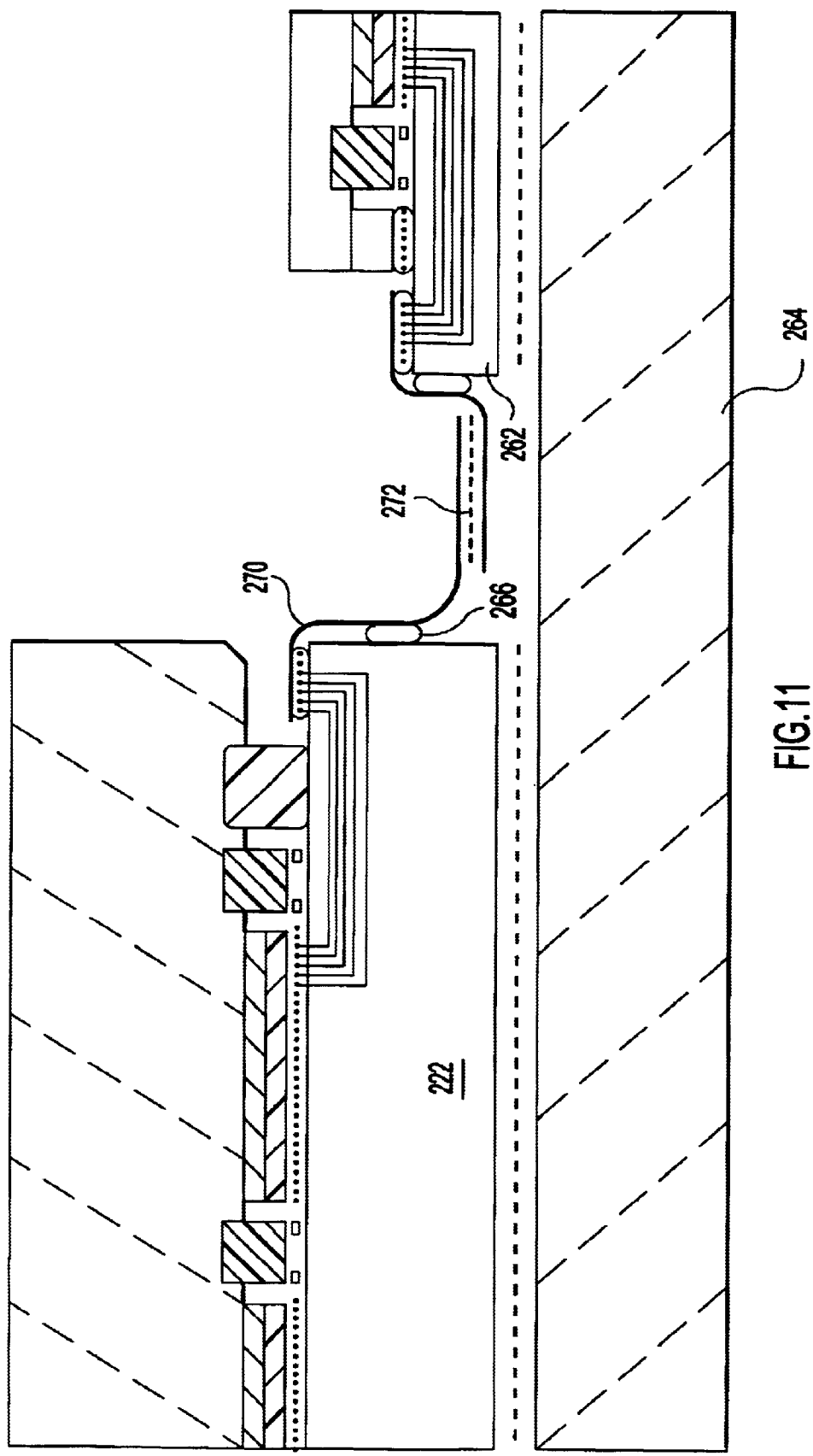

FIG. 11 shows another example in cross section substantially similar to the example of FIG. 10 with like elements labeled identically. In this example, intermediate attach structures 270 are attached to both module substrates 222, 262 and connected together at join area 272 after each is mounted to printed circuit card 264. Thus, signals pass directly between module substrates 222, 262 without passing to the printed circuit boards.

Figure 12:
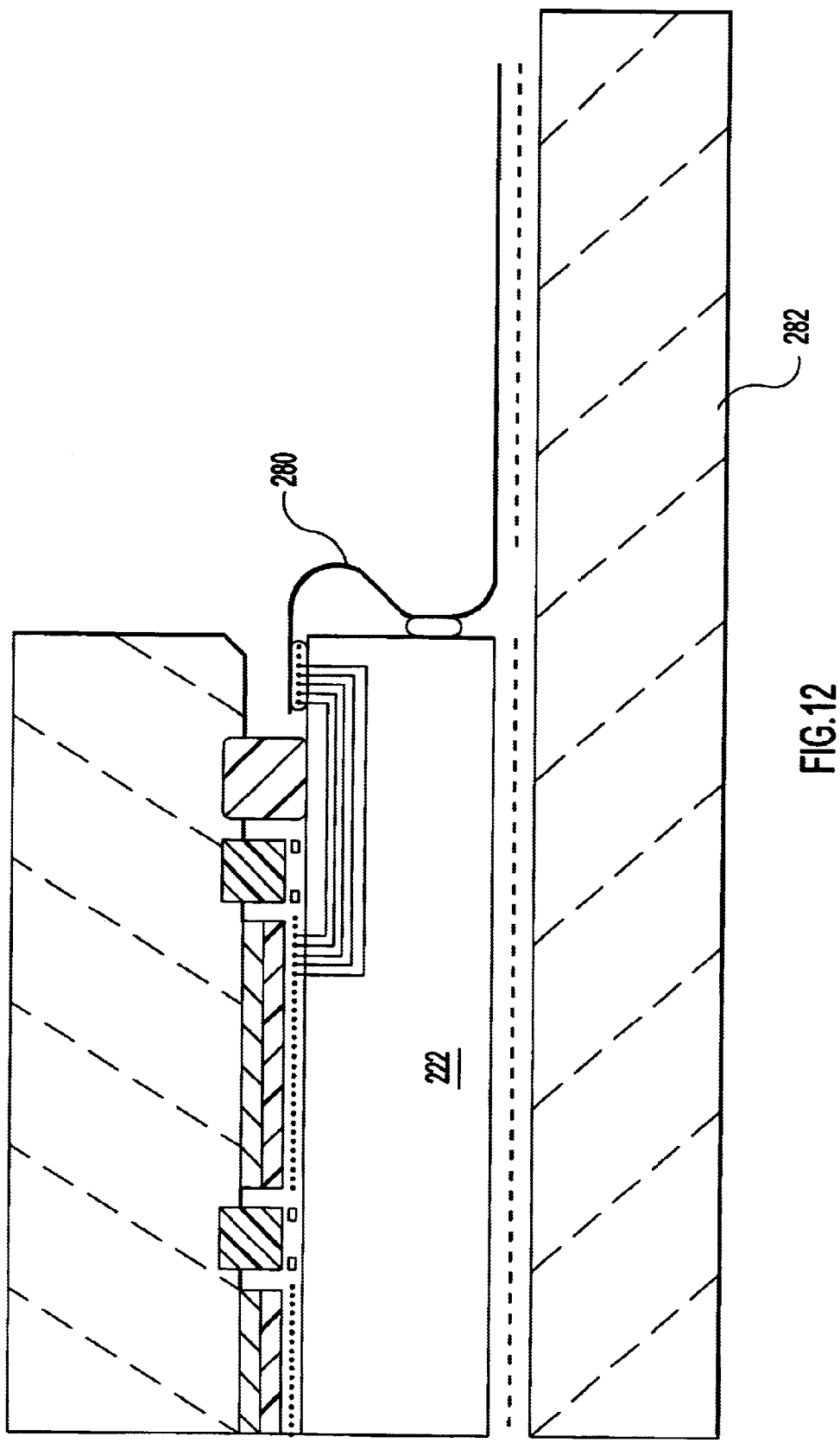

Finally, FIG. 12 shows another example in cross section substantially similar to the example of FIG. 10 with like elements labeled identically. In this example, the intermediate attach structures 280 attach the module 222 directly to printed circuit card 282, substantially supplementing the number of module I/Os available.

Accordingly, the present invention overcomes may of the limitation of prior art attachment techniques without restricting performance or increasing costs and may reduce system cost. The preferred formable wiring structure adds considerable connection flexibility, allowing very wide busses with many parallel signal paths to be continued between adjacent chips and/or modules and passed to/from the printed circuit card. Further, this very wide total bandwidth is achieved with short propagation delays and at relatively low cost and high density. More generally, this enables efficient connection between substrate and components, while maintaining chip signal pitch.

Furthermore, by application of the present invention to larger subsystems, L2 and L3 caches can be closely tied to a $\mu$P effectively forming a high performance hypercached $\mu$P subassembly containable within the foot print or nearly within the footprint of the $\mu$P itself. Such a hypercached $\mu$P can rapidly fulfill CPU data read/write requests. Further, these requests can be fulfilled so rapidly and efficiently that the hypercached $\mu$P spends relatively little idle time waiting for data, thus improving $\mu$P performance. Also, multiple powerful $\mu$P chips may be mounted closely together for use in building more complex hardware such as the IBM S/390 Mainframe.

While the invention has been described in terms of several (example) preferred embodiments, those skilled in the art will recognize that the invention can be practiced with modification within the spirit and scope of the appended claims.

We claim:

1. An intermediate wiring structure for connecting chip signals off-chip, said intermediate wiring structure comprising:
    a plurality of wiring layers;
    a plurality of dielectric layers, each of said plurality of dielectric layers separating a pair of adjacent wiring layers, wherein said plurality of wiring layers and said dielectric layers are a formable structure; and
    a plurality of attachment locations on at least two outer dielectric surface layers, said plurality of attachment locations including a module attachment location on one said outer dielectric surface layer and a plurality of chip attach location, a centrally located one of said chip attach locations on a second said outer dielectric surface layer being a primary chip attach location, remaining ones of said plurality of chip attach locations being located radially outward from said primary chip attach location on either of said at least two outer dielectric surface layers.

2. An intermediate wiring structure as in claim 1, wherein at least one of said plurality of attachment locations is a primed circuit card attachment location.

3. An intermediate wiring structure as in claim 1, wherein two of said plurality of attachment locations are a module attachment locations.

4. An intermediate wiring structure as in claim 1, wherein at least one of said plurality of attachment locations is a formable wiring structure attachment location.

5. An intermediate wiring structure as in claim 1, further comprising a plurality of decoupling capacitor locations.

6. An intermediate wiring structure as in claim 1, herein wire on said wiring layers are jogged at a bend zone.

7. An intermediate wiring structure as in claim 1, wherein ones of said plurality of wiring layers are dedicated power layers.

8. A multichip module including at least one attached intermediate wiring structure as in claim 1.

9. A printed circuit card including at least multichip module attached in part by an intermediate wiring structure as in claim 1.

10. An interposer comprising:

a formable wiring structure comprising:
- a plurality of wiring layers,
- a plurality of dielectric layers, each of said plurality of dielectric layers separating a pair of adjacent wiring layers, and
- a plurality of attachment locations on at least two outer dielectric surface layers, said plurality of attachment locations including at least one module attach location on a first outer dielectric surface layer and a plurality of chip attach locations, said plurality of chip attach locations including a primary chip location centrally located opposite said module attach location on a second outer dielectric surface layer; and
- a chip attached to each said chip attach location, a primary chip being attached to said primary chip location, chips attached to remaining ones of said plurality of chip attach locations being located radially outward from said primary chip on either of said at least two outer dielectric surface layers.

11. An interposer as in claim 10, wherein ones of said plurality of wiring layers are dedicated power layers.

12. A multichip module including an interposer as in claim 10.

13. A multichip module including plurality of interposers as in claim 10.

14. An interposer as in claim 11, wherein wire on said wiring layers are jogged at a bend zone adjacent to said module attach location.

15. An interposer as in claim 14, further comprising a plurality of decoupling capacitors.

16. An interposer as in claim 15 wherein said primary chip is a microprocessor and a plurality of local storage chips are attached to ones of said remaining ones of said chip attach locations.

17. An interposer as in claim 16, wherein said local storage comprises static random access memory in a level 2 cache and dynamic random access memory in a level 3 cache.

18. An interposer as in claim 17 further comprising a rim around said microprocessor at bend zones adjacent to said microprocessor, portion a of said formable wiring structure outboard of said rim containing said L2 cache and said L3 cache and being bent away from said opposite side.

19. A multichip module including a plurality of interposers, at least one of said interposers being an interposer as in claim 18.

* * * * *